(12) United States Patent
Hirotsu et al.

(10) Patent No.: US 6,609,232 B2
(45) Date of Patent: Aug. 19, 2003

(54) LOGIC COMPOUND METHOD AND LOGIC COMPOUND APPARATUS

(75) Inventors: Teppei Hirotsu, Hitachi (JP); Ryo Fujita, Hitachi (JP); Kotaro Shimamura, Hitachinaka (JP); Hiromichi Yamada, Hitachi (JP); Dai Fujii, Hitachi (JP); Haruyuki Nakayama, Palo Alto, CA (US)

(73) Assignee: Hitachi, Ltd., Tokyo (JP)

( * ) Notice: Subject to any disclaimer, the term of this patent is extended or adjusted under 35 U.S.C. 154(b) by 130 days.

(21) Appl. No.: 09/791,818

(22) Filed: Feb. 26, 2001

(65) Prior Publication Data

US 2001/0056568 A1 Dec. 27, 2001

(30) Foreign Application Priority Data

Jun. 13, 2000 (JP) ........................................ 2000-177327

(51) Int. Cl.[7] ................................................. G06F 9/45
(52) U.S. Cl. ...................... 716/6; 716/5; 716/6; 716/10
(58) Field of Search ............................. 716/6, 5, 4, 10, 716/12, 18, 8; 375/371

(56) References Cited

U.S. PATENT DOCUMENTS

| | | | | |
|---|---|---|---|---|
| 5,003,487 A | * | 3/1991 | Drumm et al. | ................ 716/18 |
| 5,999,716 A | * | 12/1999 | Toyonaga | ..................... 716/10 |
| 6,071,003 A | * | 6/2000 | Ashuri et al. | .................. 716/10 |
| 6,145,116 A | * | 11/2000 | Tawada | ........................ 716/10 |
| 6,192,092 B1 | * | 2/2001 | Dizon et al. | ................. 375/371 |
| 6,216,252 B1 | * | 4/2001 | Dangelo et al. | ................ 716/1 |

FOREIGN PATENT DOCUMENTS

JP          10214280          8/1998

OTHER PUBLICATIONS

Design Wave Magazine, pp. 36–43, May 1999.

* cited by examiner

*Primary Examiner*—Vuthe Siek
*Assistant Examiner*—Binh C. Tat
(74) *Attorney, Agent, or Firm*—Antonelli, Terry, Stout & Kraus, LLP

(57) ABSTRACT

In logical compound of inter-subblock paths, circuits including all inter-subblock paths are generated. Logical compound is conducted for the generated circuits to achieve logical compound of the inter-subblock paths. By treating inter-subblock paths as intra-subblock paths, no input/output delay restriction is required for the logical compound of inter-subblock paths. This makes it possible to fully use performance of the logical compound tool, and hence the inter-subblock paths can be optimized through one operation of the processing.

6 Claims, 11 Drawing Sheets

FIG. 9

```
module A(in,out,clk);
input in;
output out;
wire i1, i2;
assign i1 = ~in;
assign i3 = ~i2;
assign out = ~i4;
always @(posedge clk)
begin
 i2 < = i1;
end
always @(posedge clk)
begin
 i4 < = i3;
end
endmodule
```

FIG. 10

```
create_clock clk -period 10
set_input_delay 6 -clock clk in
set_output_delay 1 -clock clk out
```

| CELL NAME (PORT) | INPUT | OUTPUT | FUNCTION | DELAY | AERA |
|---|---|---|---|---|---|
| invd0(in, out) | in | out | INVERTER | in -> out:9ns | 1 |
| invd1(in, out) | in | out | INVERTER | in -> out:7ns | 2 |
| invd2(in, out) | in | out | INVERTER | in -> out:3ns | 3 |
| ... | ... | ... | ... | ... | ... |
| ff(in, out,clk) | in<br>clk | out | FF | in -> out:0.5ns<br>clk -> out:0.5ns | ... |
| ... | | ... | ... | ... | ... |

FIG. 13

```
module A(in,out,clk);
input in;
output out;
wire i1, i2;
invd2 u1(in,i1);
invd0 u2(i2,i3);
invd1 u3(i4,out);
ff f1(i1,i2,clk);
ff f2(i3,i4,clk);
endmodule
```

LOGIC COMPOUND METHOD AND LOGIC COMPOUND APPARATUS

BACKGROUND OF THE INVENTION

The present invention relates to a logic compound method and a logic compound apparatus using a register transfer level (RTL) description for a large-scale integrated (LSI) circuit including a plurality of subblocks.

In the recent development of LSI circuits, there has been broadly employed a design technique described, for example, in pages 36 to 43 of the "Design Wave Magazine" (May, 1999). Specifically, functional specifications of circuits necessary for a target LSI circuit are described in RTL notation to achieve logical compound according to the RTL description to obtain optimal gate levels for an actual production process of the LSI circuit.

The RTL description will be simply described. FIG. 8 shows in a flowchart a processing flow of an LSI circuit development using an RTL description. The processing flow includes steps 81 to 84.

Step 81 receives as an input thereto functions of a target LSI circuit designed in an RTL description at a higher abstraction level. Step 82 conducts logical compound using the contents of the RTL description to convert the RTL description into a gate net list optimized for an actual production process the LSI circuit.

Step 83 conducts allocation and wiring according to the gate net list to determine positions and wiring for the actual LSI circuit and resultantly generates a mask pattern. Step 84 produces the LSI circuit using the mask pattern.

Referring now to FIGS. 9 to 13, description will be given of the RTL description, a technology library, and compound restrictions as inputs to the logical compound processing, the gate net list as an output from the logical compound processing, and a logical compound operation using these items.

FIG. 9 shows an RTL description of a model circuit, i.e., circuit A. The respective lines have meanings as below.

Line 1 of FIG. 9 represents a first point of definition of circuit A and includes a syntax rule of "module circuit-name (port list)".

Lines 2 to 4 represent an input/output signal definition, an output signal definition, and an internal signal definition in the following syntax rules.

Line 2: input input-signal-list;
Line 3: output output-signal-list;
Line 4: wire internal-signal-list;

Lines 5 to 7 describe combinations of circuits (combined circuits) as follows.

Line 5: Description of inverter which inverts input "in" and outputs the inverted signal to i1
Line 6: Description of inverter which inverts input "in2" and outputs the inverted signal to i3
Line 7: Description of inverter which inverts input "in4" and outputs a resultant signal to out Lines 8 to 11 describe a storage element, i.e., a flip-flop (FF) circuit. This flip-flop circuit has an input "in" and an output "out" and is synchronized with a rising edge of a clock signal clk.

Lines 12 to 15 similarly describe a storage element, i.e., a flip-flop circuit. This flip-flop circuit has an input "i2" and an output "out" and is synchronized with a rising edge of a clock signal clk.

Line 16 indicates an end of the circuit definition.

A compound restriction includes a circuit clock definition and an input/output delay (delay time) restriction. The compound restriction indicates delay targets of paths (signal paths between an input pin and a flip-flop circuit, between flip-flop circuits, and between a flip-flop circuit and an output pin) in the circuit to a logical compound tool.

FIG. 10 shows a concrete example of compound restrictions of circuit A. The values are represented in nanoseconds (ns).

For explanation, assume that FIG. 11 shows a relationship between a circuit represented by the RTL description of FIG. 9 and the delay targets indicated by the compound restrictions of FIG. 10.

Line 1 of FIG. 10 is a clock definition which defines that a clock signal clk has a period of 10 ns. This gives a delay target 1101 indicating the logical compound tool to construct a circuit in which delay of a signal between flip-flop circuits synchronized with the clock clk is equal to or less than 10 ns.

Line 2 of FIG. 10 is an input delay restriction. This indicates that a combined circuit 1111 having a delay of six nanoseconds exists between an external flip-flop circuit and the input port "in". Therefore, this gives a delay target 1102 indicating the logical compound tool to construct a circuit in which delay of a signal from the input port "in" to the flip-flop circuit synchronized with the clock clk is 4 (=10−6) ns.

Line 3 of FIG. 10 is an output delay restriction and means that a combined circuit 1112 with a delay of 1 ns exists between an output port "out" of the circuit and a flip-flop circuit synchronized with the clock clk. Therefore, this gives a delay target 1103 indicating the logical compound tool to construct a circuit in which delay of a signal from the flip-flop circuit synchronized with the clock clk to the output port "out" 9 (=10−1) ns.

A technology library is a table including functions and parameters of logical elements (to be referred to as cells herebelow) such as an AND element, an OR element, and a flip-flop element which can be generated in the LSI circuit production process. FIG. 12 shows an example of the contents of the technology library.

First, the logical compound is achieved using the RTL description of circuit A shown in FIG. 9 according to the compound restrictions of FIG. 10. The results of the logical compound are then converted into a gate net including cells listed in the technology library shown in FIG. 12. FIG. 13 shows a gate net list resultant from the conversion.

In the gate net list shown in FIG. 13, lines 1 to 4 are the same as the RTL description of FIG. 9, namely, include a definition of a start point of module definition and definitions of input/output signals and internal signals.

Lines 5 to 9 of FIG. 13 indicate a connection relationship and a description to instance a function of a technology library cell and are described in a syntax rule of cell name instance-name (port list);
Line 10 indicates an end of the module definition.

Line 5 is obtained by instancing an inverter 1121 of the circuit in the RTL description of FIG. 11 using an inverter invd2 cell of the technology library of FIG. 12. In the operation, the logical compound tool selects, according to the delay target 1102 that the delay from the input "in" to the input "i1" of the flip-flop element is 4 ns or less, invd2 with a delay of 3 ns from the cells invd0 to invd3 having the same function in the technology library.

Line 6 is obtained by instancing an inverter 1122 of the circuit in the RTL description of FIG. 11 using an inverter invd0 cell of the technology library of FIG. 12. In the operation, the logical compound tool selects, according to the delay target 1101 that the delay between the flip-flop elements is 10 ns or less, invd0 with a smallest area among the cells invd0 to invd3 having the same function in the technology library.

As above, when a plurality of cells satisfy one delay target, the logical compound tool selects one of the cells having the smallest area among the cells.

Line 7 is obtained by instancing an inverter 1123 of the circuit in the RTL description of FIG. 11 using an inverter invd1 cell of the technology library of FIG. 12. In the operation, the logical compound tool selects, according to the delay target 1103 that the delay between the flip-flop elements is 9 ns or less, invd1 with a smallest area among the cells invd0 and invd1 having the same function in the technology library.

Lines 8 and 9 are obtained by instancing a flip-flop element in the RTL description of FIG. 11 using a flip-flop element in the technology library of FIG. 12.

As described above, the logical compound processing interprets the RTL description and replaces a description item of a flip-flop element with a cell of a flip-flop element in the technology library of the LSI circuit production process. For a combined circuit in the RTL description, the logical compound processing implements a circuit to satisfy a path delay target indicated by the compound restrictions using the a cell in the technology library of the LSI circuit production process.

The processing above will be called "gate mapping of combined circuits" herebelow.

In logical compound processing of a long RTL description, there is usually employed a partition compound method in which the RTL description is divided into partitions or subblocks each having a size suitable for the logical compound tool. The logical compound processing is then conducted for each subblock of the RTL description.

This is used because of advantages that the memory capacity required for the logical compound tool is small and the processing time is reduced. Additionally, for any modification in the results of the RTL description, it is necessary to conduct the logical compound processing only for the subblock including the RTL description. This minimizes the turnaround time (TAT) of the processing.

To carry out the logical compound for each subblock in the partition compound processing, compound restrictions are required for the subblock.

The subblock compound restrictions specifically indicate a clock definition and input/output delay restrictions and act on the subblock logical compound as below.

To conduct logical compound of an intra-subblock path between flip-flop elements in a subblock, the path delay target is calculated using a clock definition and a combined circuit in the path is logically compounded to minimize discrepancy between the delay of the path and the path delay target.

To conduct logical compound of an external path of a subblock from an external pin to a flip-flop element in the subblock, the delay value of the path and the path delay target are calculated using the input/output delay restrictions and a combined circuit in the path is logically compounded to minimize discrepancy between the delay of the path and the path delay target.

To generate the input/output delay restrictions, there may be used a method in which the designer manually generates the restrictions in consideration of the circuit configuration and a method in which, as in the "interlayer delay distribution method" described in JP-A-10-214280, the entire circuit before logical compound is accessed to obtain information of each path between subblocks as objects of the logical compound so as to automatically generate input/output delay restrictions for each subblock according to the information.

The prior art has been attended with a problem when a flip-flop element at a start point of a path and an end point thereof exist in mutually different subblocks. That is, for an inter-subblock path passing a boundary between the subblocks, the logical compound is separately carried out as an external path for each subblock. Since the delay between the inter-subblock path depends on input/output delay restrictions controlling the logical compound for each external path, there arises a problem as follows.

First, a partition compound operation using the input/output delay restrictions is conducted regardless of how the input/output delay restrictions are generated, namely, manually or automatically. The logical compound to produce combined circuits in the inter-subblock path is not carried out by checking the logical structure and the delay in the entire inter-subblock path under the logical compound operation.

Therefore, to optimize an inter-subblock path in the prior art, it is necessary to repeatedly execute processing:

Generation and modification of input/output delay restrictions→Logical compound processing→Verification of timing for inter-subblock path.

However, even if the processing is repeatedly executed, it is not necessarily guaranteed that the value of delay of the inter-subblock path converges.

Consequently, in the prior art in which input/output delay restrictions are manually generated, the restrictions must be generated such that the difference between the delay of the inter-subblock path and the target delay is minimized. This requires a considerable amount of human power.

In the prior art in which input/output delay restrictions are automatically generated, the restrictions are generated using the RTL description in which changes in the combined circuits after the logical compound are not taken into consideration. There often arises a problem in which as a result of excessively strict restrictions, the circuit area which should be otherwise smaller is increased or in which as a result of excessively light restrictions, a violation path which should be otherwise solved remains unsolved.

SUMMARY OF THE INVENTION

It is therefore an object of the present invention to provide a logic compound method and a logic compound apparatus in which delay values of all paths can approach respective target values through one operation of processing and hence the inter-subblock paths can be easily optimized with a little amount of human power in a short period of time.

To achieve the object in accordance with the present invention, there is provided a logical compound method comprising the steps of subdividing a logic circuit described in RTL notation into a plurality of subblocks, conducting logical compound for each of the subblocks, executing intra-subblock path delay adjustment processing in which logical compound is conducted using at least a clock definition such that delay of each intra-subblock path approaches a target value thereof for each of the subblocks, and executing inter-subblock path delay adjustment processing in which logical compound is conducted using at least a clock definition such that that delay of each path selected from a group including a path between the logic circuit and one of the subblocks and paths between the subblocks approaches a target value thereof.

In accordance with the present invention, in the logical compound method according, the inter-subblock path delay adjustment processing may comprise the step of replacement processing which generates, in each of the subblocks, a combined circuit on a fan-out trace with a start point at an external pin of the subblock, a combined circuit on a fan-in trace with a start point at an external pin of the subblock, a subblock boundary section including a flip-flop element of the fan-out trace of the combined circuit, and a subblock boundary section including a flip-flop element of the fan-in trace of the combined circuit and which replaces according to an RTL description the subblocks respectively with the subblock boundary sections respectively associated therewith.

In accordance with the present invention, in the logical compound method, the intra-subblock path delay adjustment processing may be concurrently executed for the respective subblocks.

According to the present invention, an inter-subblock path can be treated as an intra-subblock path and hence no input/output delay restriction is required to compound the inter-subblock path. Therefore, performance of the logical compound tool can be fully utilized and the inter-subblock paths can be optimized through one operation of processing.

BRIEF DESCRIPTION OF THE DRAWINGS

The present invention will be more apparent from the following detailed description, when taken in conjunction with the accompanying drawings, in which:

FIG. 9 is a diagram to explain an example of an RTL description;

FIG. 10 is a diagram to explain compound restrictions in RTL description;

FIG. 13 is a table to explain an example of a gate net list in an RTL description.

DESCRIPTION OF THE EMBODIMENTS

Figure 1:
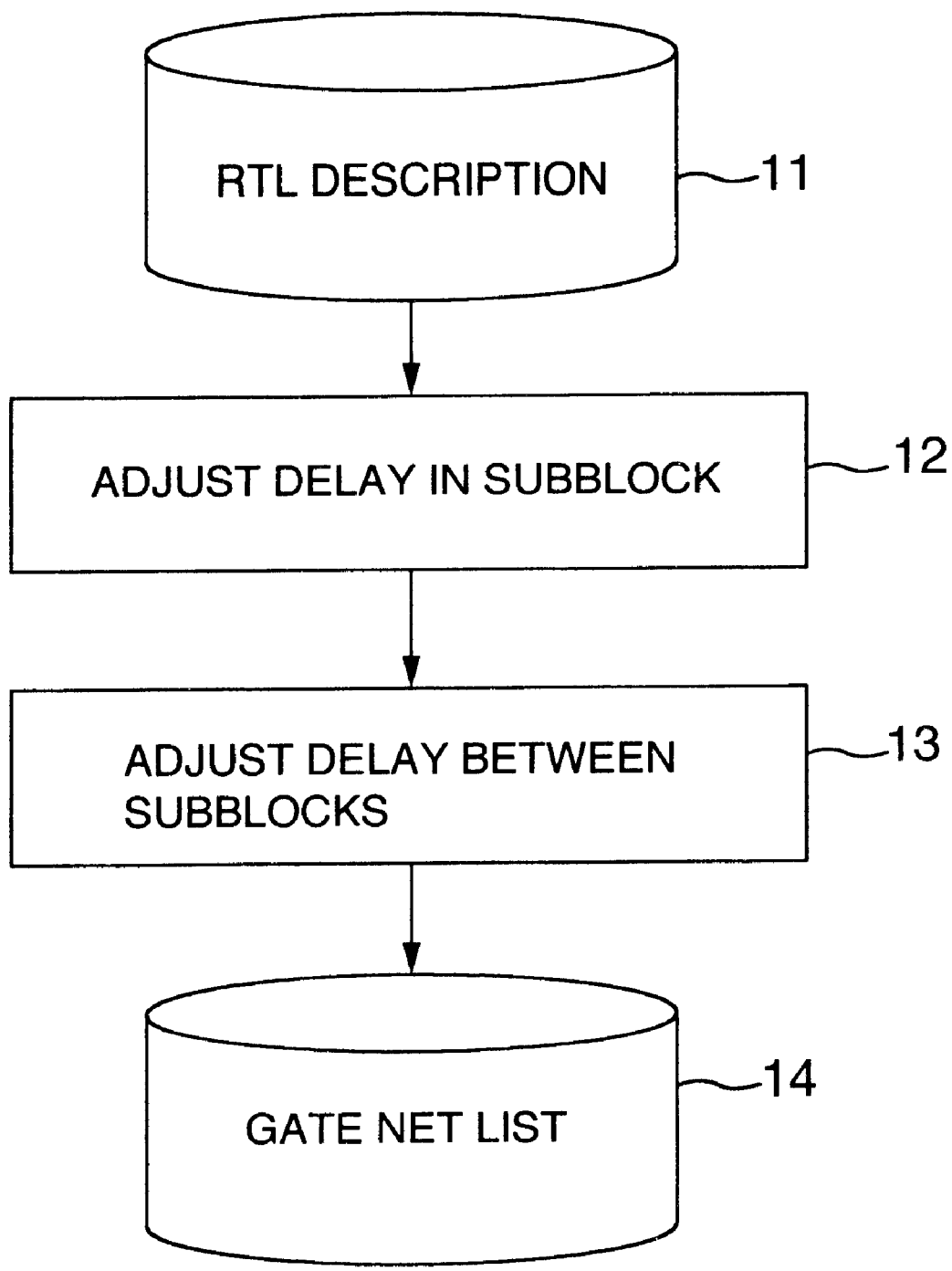
FIG. 1 is a flowchart to explain processing of an embodiment of logical compound according to the present invention.

Referring now to the drawings, description will be given of embodiments of the logical compound method and the logical compound apparatus according to the present invention.

Figure 8:
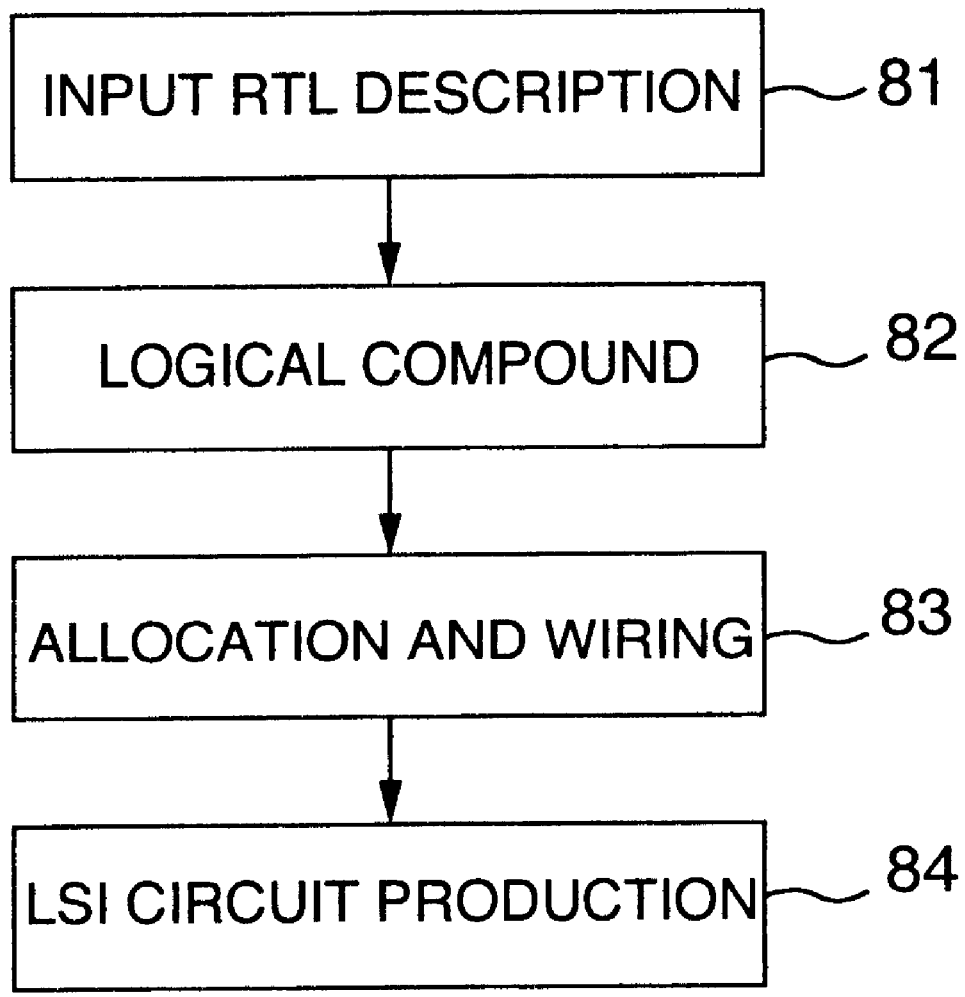
FIG. 8 is a flowchart to explain an example of a flow of developing an LSI circuit.
Figures 11, 12:
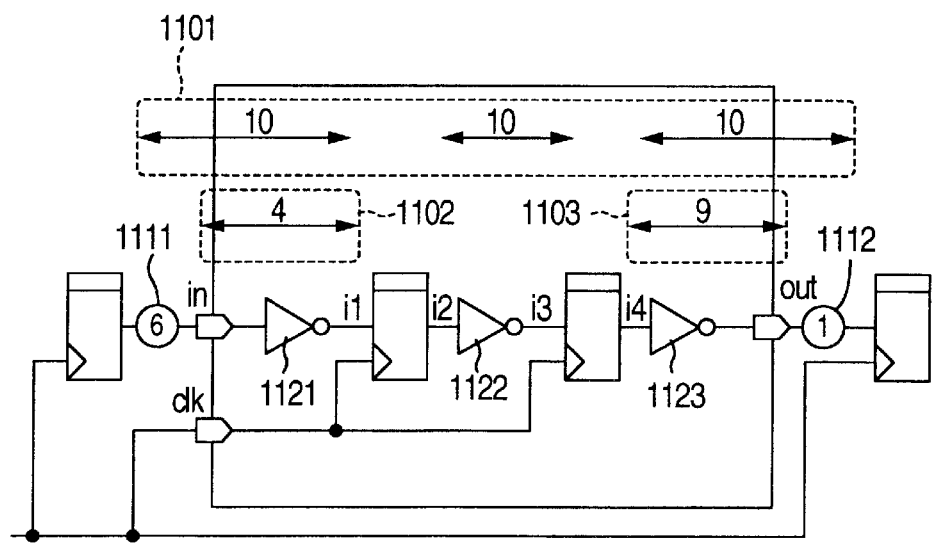
FIG. 11 is a diagram to explain a relationship between a circuit represented by an RTL description and a delay target indicated by compound restrictions.
FIG. 12 is a table to explain an example of a technology library in RTL description.

FIG. 1 shows an embodiment of processing in accordance with the present invention in a flowchart. This processing is executed in a logical compound step 82 of an LSI circuit developing flow shown in FIG. 8.

The processing flow of FIG. 1 includes an intra-subblock path delay adjustment step 12 which receives an RTL description 11 to minimize discrepancy between delay of each intra-subblock path and its target value, an inter-subblock path delay adjustment step 13 to minimize discrepancy between delay between subblocks and its target value, and a list output step 14 to produce a gate net list.

The processing is executed by a logical compound tool which is specifically a computer including a storage such as a magnetic disk or a semiconductor memory to store programs, a processor such as a central processing unit (CPU) to execute the programs in the storage according to inputs from a keyboard and/or a mouse, and a display to display a process of the processing and/or results of the processing.

The RTL description, intermediate data produced during the processing, and the gate net list 14 are stored in the storage of the computer. These items are written thereon or read therefrom when necessary.

Referring next to FIGS. 2 to 7, description will be given of a circuit represented by an RTL description of the embodiment, an intermediate circuit and a gate net list generated during the processing, and processing of the embodiment. Assume that the gate net list operates with a frequency of 100 megaherz (MHz).

Figure 2:
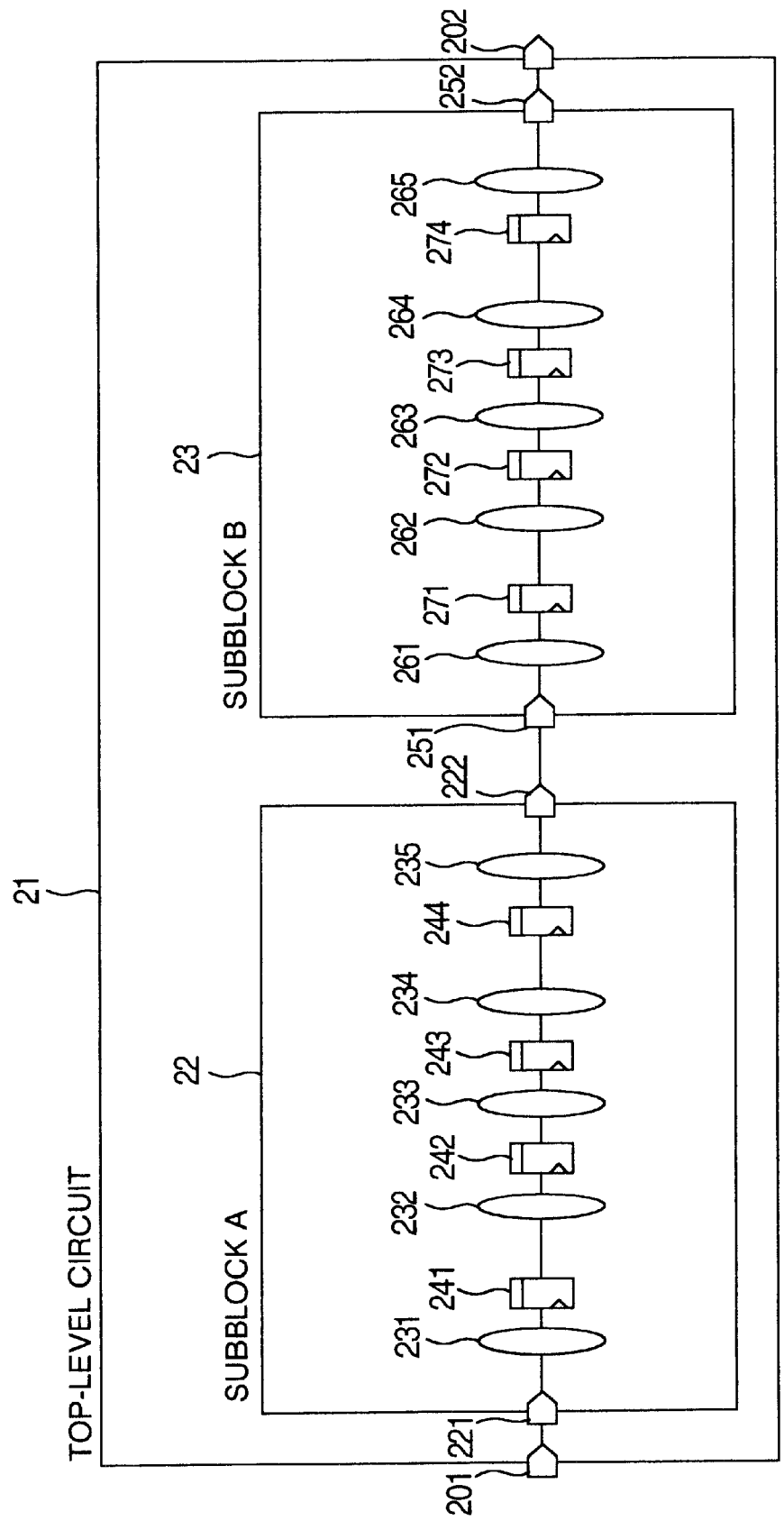
FIG. 2 is an explanatory diagram showing an example of a circuit as an object of logical compound in an embodiment according to the present invention.

FIG. 2 shows a top-level circuit represented by an RTL description of this embodiment. The top-level circuit 21 includes lower-level circuits in a hierarchical layout, namely, a subblock A 22 and a subblock B 23 both of which have a size to be handled by the logical compound tool. The top-level circuit has an input pin 201 and an output pin 202, the subblocks A has an input pin 221 and an output pin 222, and the subblocks B has an input pin 251 and an output pin 252. The pins 201, 222, 251, 252, and 202 are connected as shown in FIG. 2.

First, description will be given of the intra-subblock path delay adjustment 12.

The adjustment processing 12 assigns a clock definition for each subblock to conduct logical compound.

Using the clock definition, a delay target is calculated for each path between flip-flop elements in the subblock (intra-subblock path). Gate mapping is conducted for each combined circuit in the paths such that delay of the path approaches the associated target value.

Since this embodiment aims at configuring a circuit to operate with 100 MHz, a clock definition of 100 MHz is assigned. Therefore, the delay target for each path between flip-flop elements in the subblock (intra-subblock path) is 10 ns.

Figure 3:
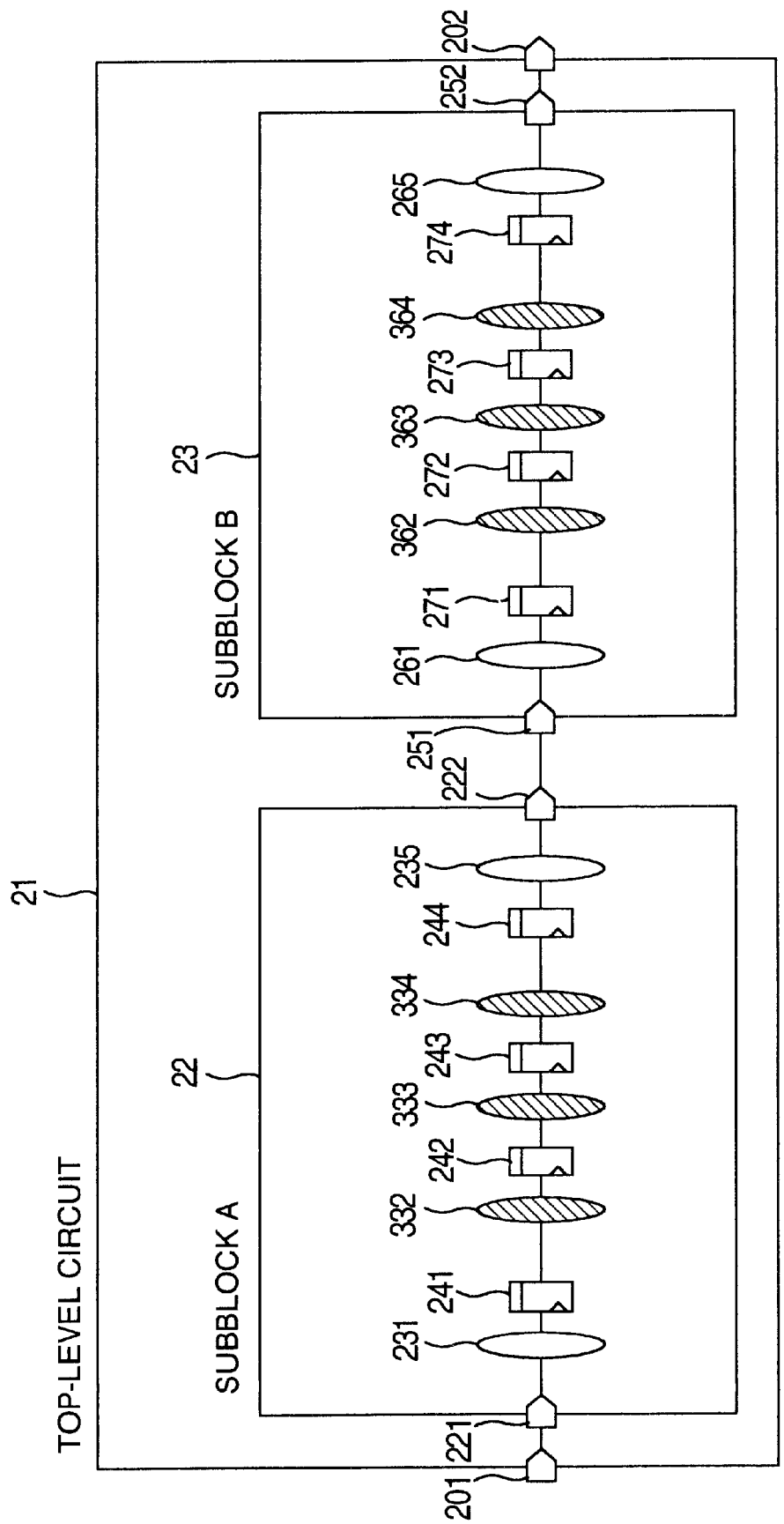
FIG. 3 is an explanatory diagram showing intra-subblock delay adjustment executed by an embodiment according to the present invention.

FIG. 3 shows a circuit obtained by achieving the intra-subblock path delay adjustment 12 for the circuit shown in FIG. 2.

As can be seen from FIG. 2, for each of a combined circuit 232 between flip-flop elements 241 and 242, a combined circuit 233 between flip-flop elements 242 and 243, and a combined circuit 234 between flip-flop elements 243 and 244 of the subblock A 22, the gate mapping is conducted such that each path delay thereof approaches 10 ns. Resultantly, combined circuits 332, 333, and 334 are obtained as shown in FIG. 3.

Similarly, as can be seen from FIG. 2, for each of a combined circuit 262 between flip-flop elements 271 and 272, a combined circuit 263 between flip-flop elements 272 and 273, and a combined circuit 264 between flip-flop elements 273 and 274 of the subblock B 23, the gate mapping is conducted such that each path delay thereof approaches 10 ns. Resultantly, combined circuits 362, 363, and 364 are obtained as shown in FIG. 3.

In FIG. 3, the hatched circuits 332 to 334 and 362 to 364 indicate that the gate mapping has been conducted for the circuits such that the path delay of each circuit approaches its target value (10 ns in this case).

In this situation, intra-block paths as objects of the intra-block path delay adjustment 12 are closed in each subblock and are completely separated between the subblocks.

The delay adjustment 12 can be independently conducted for each subblock. It is therefore possible to concurrently execute the adjustment processing 12 to minimize a period of time to execute the processing 12 for many subblocks. Such concurrent execution of the processing 12 can be conducted by distributing the processing 12 to a plurality of central processing units or to a plurality of computers connected to a network.

Next, description will be given of the inter-subblock delay adjustment 13.

In the adjustment processing 13, boundary sections are generated in the respective subblocks.

Figure 4:
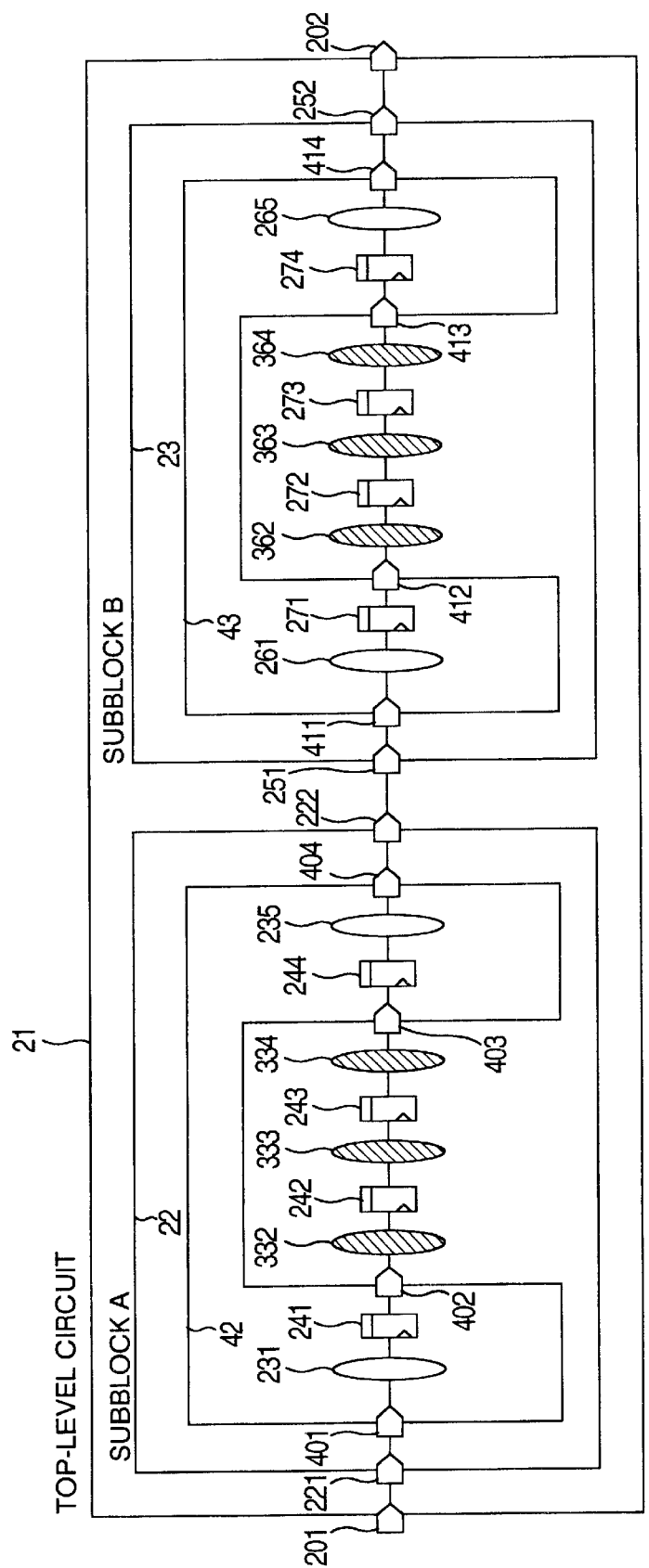
FIG. 4 is an explanatory diagram showing a starting stage of the inter-subblock delay adjustment executed by an embodiment according to the present invention.

FIG. 4 shows subblock boundaries generated in the respective subblocks of the circuit 3 after the inter-subblock delay adjustment 13.

In the subblock A 22, there is generated a new circuit of the subblock A 22 at a lower hierarchic level, namely, a subblock A boundary section 42 including a combined circuit 231 in a fan-out trace from the input pin 221, a flop—flop element 241 as an end point of the fan-out trace from the input pin 221, a combined circuit 235 in a fan-in trace to the output pin 222, and a flop—flop element 244 as an end point of the fan-in trace to the input pin 222.

In the subblock B 23, there is generated a new lower-level circuit of the subblock B 23, namely, a subblock B boundary section 43 including a combined circuit 261 in a fan-out trace from the input pin 251, a flop—flop element 271 as an end point of the fan-out trace from the input pin 251, a combined circuit 265 in a fan-in trace to the output pin 252, and a flop—flop element 274 as an end point of the fan-in trace to the input pin 252.

Figure 5:
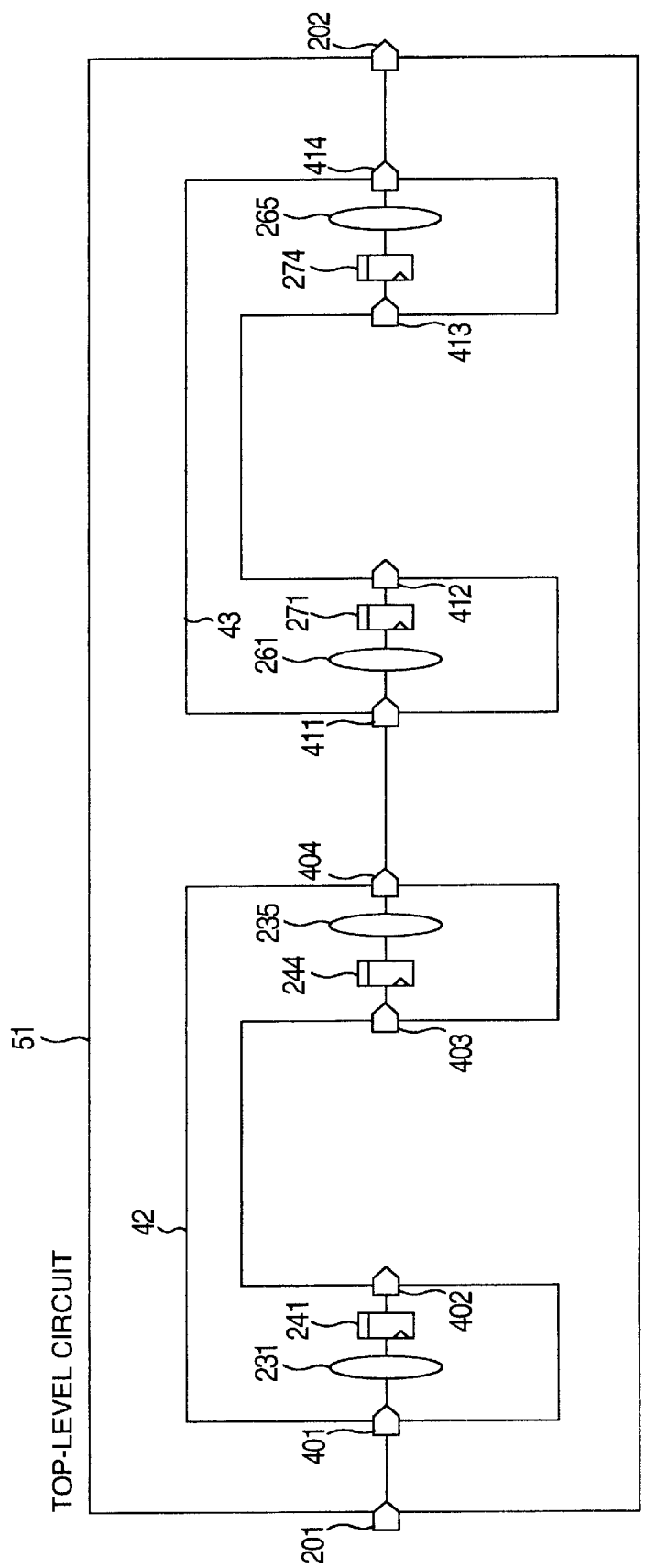
FIG. 5 is an explanatory diagram showing a first stage of the inter-subblock delay adjustment executed by an embodiment according to the present invention.

As shown in FIG. 5, in place of the subblock A 22, the subblock A boundary section 42 is linked with the circuit 21. In pace of the subblock B 23, the subblock B boundary section 43 is linked with the circuit 21. There is resultantly created an inter-subblock delay adjusting circuit 51 including only paths associated with input/output signals of the top-level circuit and inter-subblock paths.

Alternatively, by generating an RTL description for each subblock such that a circuit in a level includes gates in a fan-out trace from an external pin or a fan-in trace to an external pin and flip-flop elements as end points of the trace, an inter-subblock path delay adjusting circuit can be configured using the circuit as a subblock boundary section.

For the inter-subblock delay adjusting circuit 51 created as above, input/output delay restrictions and clock definitions with respect to the input pin 201 and the output pin 202 are inputted to execute logical compound processing.

Assume, for example, that "external delay=3 ns" is specified as an input/output delay restriction for the input pin 201. Then, the delay target of a path between the input pin 201 and the flip-flop element 241 is obtained as 7 ns. The gate mapping is conducted for the combined circuit 231 such that the delay approaches 7 ns.

Similarly, assume that "external delay=3 ns" is specified as an input/output delay restriction for the output pin 202. Then, the delay target of a path between the input pin 202 and the flip-flop element 271 is obtained as 7 ns. The gate mapping is conducted for the combined circuit 265 such that the delay approaches 7 ns.

As in the intra-subblock path delay adjustment, the path target becomes 10 ns for a path between the flip-flop elements 244 and 271. The gate mapping is conducted for the combined circuit 235 and 261 such that the delay approaches 10 ns.

Figure 6:
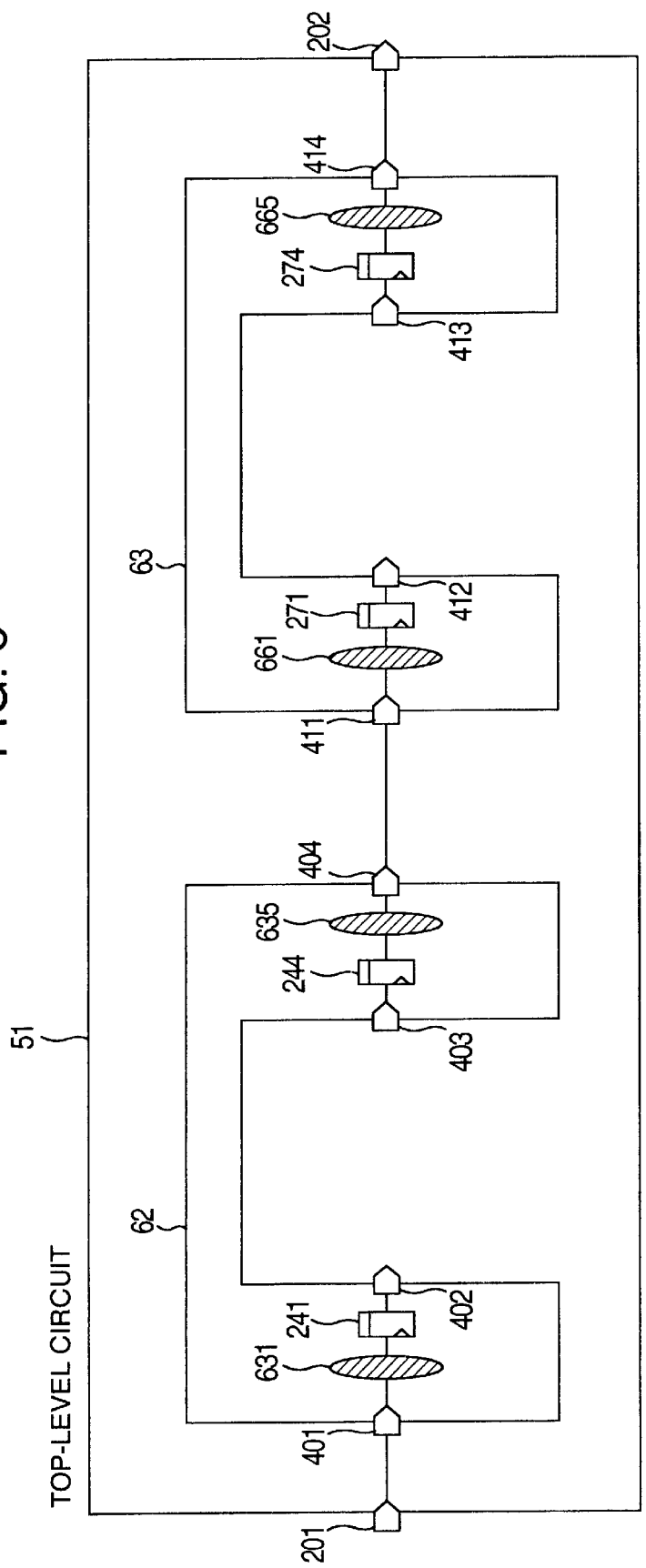
FIG. 6 is an explanatory diagram showing a second stage of the inter-subblock delay adjustment executed by an embodiment according to the present invention.
Figure 7:
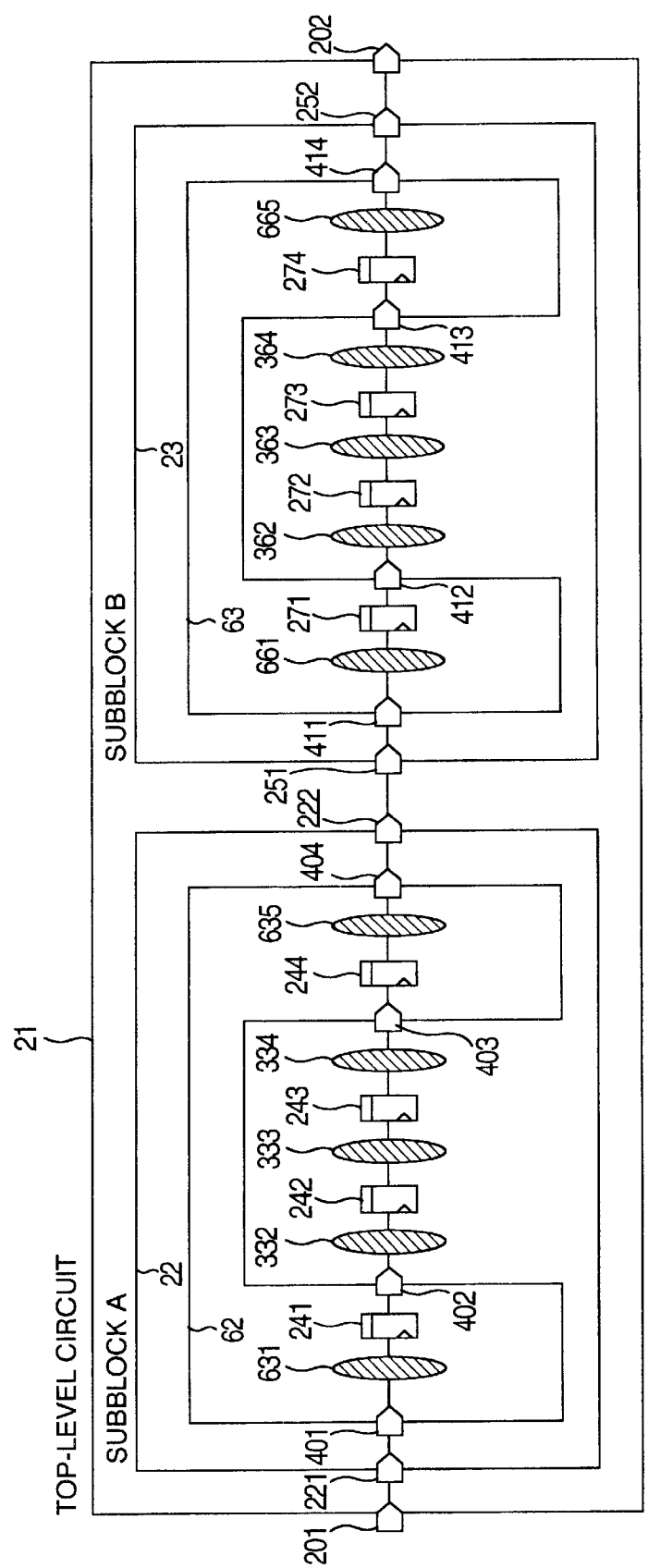
FIG. 7 is an explanatory diagram showing a third stage of the inter-subblock delay adjustment executed by an embodiment according to the present invention.

For the combined circuit 231, 235, 261, and 265 in the paths associated with input/output signals of the top-level circuit and the inter-subblock paths, the gate mapping is conducted such that the path delay approaches each associated target value. Resultantly, there are generated combined circuits 631, 635, 661, and 665 as shown in FIG. 6.

Finally, in the intermediate circuit shown in FIG. 4, the subblock A boundary section 42 and the subblock B boundary section 43 are respectively replaced with the subblock A boundary section 62 and the subblock B boundary section 63 which are resultant from the logical compound of the inter-subblock path adjusting circuits. By gate mapping the combine circuits of the circuit shown in FIG. 7 such that the path delay approaches each associated target value, thereby producing a gate net list 14.

According to the embodiment, the produced gate net list 14 can be used as optimized gate logic in the same hierarchic configuration as that of the logical compound objective circuit in the RTL logic 11.

In the embodiment, the inter-subblock path can be treated as an intra-subblock path using the inter-subblock path adjusting circuits. Therefore, no input/output delay restriction is required to compound an inter-subblock path.

Consequently, the logical compound tool can consider changes in the overall logic of the inter-subblock paths. Therefore, performance of the logic compound tool can be fully achieved to optimize the inter-subblock paths through only one operation of the processing. While executing the intra-subblock path delay adjustment, a circuit in which all paths are gate-mapped such that the path delay approaches each associated target timing value can be obtained through only one operation of the processing.

According to the embodiment, subblock boundary sections of a subblock linked through the inter-subblock path delay adjustment with inter-subblock path delay adjusting circuits are replaced with subblock boundary sections of the original subblock. Therefore, optimization of combined circuits on the inter-subblock paths in the inter-subblock path delay adjustment can be easily reflected in the original RTL description.

According to the embodiment, since the inter-subblock path delay adjustment processing can be concurrently executed using different CPUs of one computer or different computers, the logical compound processing can be executed at a higher speed.

According to the embodiment, an RTL description of a subblock is produced such that gates on a fan-out trace or a fan-in trace with a start point at an external pin and flip-flop elements as end points of the traces exist in one hierarchic level. Using the subblock as a subblock boundary section, there is produced an inter-subblock path delay adjusting circuit. That is, without using any auxiliary tool to generate a subblock boundary section, the inter-subblock path delay adjusting circuit can be easily created.

According to the present invention, the logical compound tool can consider changes in the overall logic of the inter-subblock paths. Therefore, performance of the logic compound tool can be fully achieved to optimize the inter-subblock paths through only one operation of the processing. While executing the intra-subblock path delay adjustment, a circuit in which all paths are gate-mapped such that the path delay approaches each associated target timing value can be obtained at a high speed through only one operation of the processing.

The specification and drawings are, accordingly, to be regarded in an illustrative rather than a restrictive sense. it will, however, be evident that various modifications and changes may be made thereto without departing from the broader spirit and scope of the invention as set forth in the claims.

What is claimed is:

1. A logical compound method for subdividing a logic circuit described in RTL notation into a plurality of subblocks and for conducting logical compound for each of the subblocks, the subdividing being performed before and after the conducting logical compound, the logical compound comprising:

executing intra-subblock path delay adjustment processing in which logical compound is conducted using at least a clock definition such that delay of each intra-subblock path approaches a target value thereof for each of the subblocks; and executing inter-subblock path delay adjustment processing in which logical compound is conducted using at least a clock definition such that that delay of each path selected from a group including a path between the logic circuit and one of the subblocks and paths between the subblocks approaches a target value thereof, wherein said inter-subblock path delay adjustment processing comprises generating, in each of the subblocks, a subblock boundary section including a first combined circuit on a fan-out trace with a start point at an external pin of the subblock, a second combined circuit on a fan-in trace with a start point at an external pin of the subblock, a first flip-flop element at the fan-out trace end of the first combined circuit, and a second flip-flop element at the fan-in trace end of the second combined circuit, and replacing the subblocks with the subblock boundary sections corresponding thereto respectively on an RTL description.

2. A logical compound method for subdividing a logic circuit described in RTL notation into a plurality of subblocks and for conducting logical compound for each of the subblocks, the subdividing being performed before and after the conducting logical compound, the logical compound comprising:

executing intra-subblock path delay adjustment processing in which logical compound is conducted using at least a clock definition such that delay of each intra-subblock path approaches a target value thereof for each of the subblocks; and executing inter-subblock path delay adjustment processing in which logical compound is conducted using at least a clock definition such that that delay of each path selected from a group including a path between the logic circuit and one of the and paths between the subblocks approaches a target value thereof; wherein said inter-subblock path delay adjustment processing comprises generating, in each of the subblocks, a subblock boundary section including a first combined circuit on a fan-out trace with a start point at an external pin of the subblock, a second combined circuit on a fan-in trace with a start point at an external pin of the subblocks, a first flip-flop element of the fan-out trace end of the first combined circuit, and a second flip-flop element of the fan-in trace end of the second combined circuit, and replacing the subblocks with the subblock boundary sections corresponding thereto respectively on an RTL description; and wherein said intra-subblock path delay adjustment processing is concurrently executed for the respective subblocks.

3. A logical compound apparatus, for subdividing a logic circuit described in RTL notation into a plurality of subblocks and for conducting logical compound for each of the subblocks, the subdividing being performed before and after the conducting logical compound, comprising:

intra-subblock path delay adjusting means for conducting logical compound using at least a clock definition such that delay of each intra-subblock path approaches a target value thereof for each of the subblocks; and inter-subblock path delay adjusting means for conducting logical compound using at least a clock definition such that delay of each path selected from a group including a path between the logic circuit and one of the subblocks and paths between the subblocks approaches a target value thereof, wherein said inter-subblock path delay adjustment processing comprises generating, in each of the subblocks, a subblock boundary section including a first combined circuit on a fan-out trace with a start point at an external pin of the subblock, a second combined circuit on a fan-in trace with a start point at an external pin of the subblock, a first flip-flop element at the fan-out trace end of the first combined circuit, and a second flip-flop element at the fan-in trace end of the second combined circuit, and replacing the subblocks with the subblock boundary sections corresponding thereto respectively on an RTL description.

4. A logical compound apparatus, for subdividing a logic circuit described in RTL notation into a plurality of subblocks and for conducting logical compound for each of the subblocks, the subdividing being performed before and after the conducting logical compound, comprising:

intra-subblock path delay adjusting means for conducting logical compound using at least a clock definition such that delay of each intra-subblock path approaches a target value thereof for each of the subblocks; and inter-subblock path delay adjusting means for conducting logical compound using at least a clock definition such that that delay of each path selected from a group including a path between the logic circuit and one of the subblocks and paths between the subblocks approaches a target value thereof; wherein said inter-subblock path delay adjustment processing comprises generating, in each of the subblocks, a subblock boundary section including a first combined circuit on a fan-out trace with a start point at an external pin of the subblock, a second combined circuit on a fan-in trace with a start point at an external pin of the subblocks, a first flip-flop element of the fan-out trace end of the first combined circuit, and a second flip-flop element of the fan-in trace end of the second combined circuit, and replacing the subblocks with the subblock boundary sections corresponding thereto respectively on an RTL description; and wherein said intra-subblock path delay adjusting means is so configured to concurrently execute the inter-subblock path delay adjustment processing for the respective subblocks.

5. A logical compound apparatus according to claim 4, wherein said processing by said intra-subblock path delay adjusting means is executed concurrently by different CPUs.

6. A logical compound apparatus according to claim 4, wherein said processing by said intra-subblock path delay adjusting means is executed concurrently by different computers.

* * * * *